US 008115316B2

(12) United States Patent
Kohara et al.

(10) Patent No.: US 8,115,316 B2
(45) Date of Patent: Feb. 14, 2012

(54) PACKAGING BOARD, SEMICONDUCTOR MODULE, AND PORTABLE APPARATUS

(75) Inventors: Yasuhiro Kohara, Gifu (JP); Ryosuke Usui, Ichinomiya (JP); Takeshi Nakamura, Isesaki (JP); Yusuke Igarashi, Isesaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 614 days.

(21) Appl. No.: 11/847,933

(22) Filed: Aug. 30, 2007

(65) Prior Publication Data
US 2008/0061437 A1 Mar. 13, 2008

(30) Foreign Application Priority Data

Aug. 30, 2006 (JP) ................................ 2006-234465
Aug. 13, 2007 (JP) ................................ 2007-211172

(51) Int. Cl.
*H01L 23/48* (2006.01)
*H01L 23/52* (2006.01)
*H01L 29/40* (2006.01)
(52) U.S. Cl. . 257/774; 257/779; 257/780; 257/E23.068; 257/E23.069; 257/E23.152
(58) Field of Classification Search .................. 257/698, 257/750, 758, 773, 774, 775, 778, E23.011, 257/E23.02, E23.021, E23.022, E23.023, 257/E23.067, E23.068, E23.069, E23.145, 257/E23.151, E23.152, E23.174, E23.175
See application file for complete search history.

(56) References Cited

U.S. PATENT DOCUMENTS

| 6,329,610 | B1 * | 12/2001 | Takubo et al. | 174/264 |
| 2001/0007373 | A1 * | 7/2001 | Kadota et al. | 257/730 |
| 2004/0188123 | A1 * | 9/2004 | Peterson et al. | 174/52.2 |
| 2005/0035464 | A1 * | 2/2005 | Ho et al. | 257/778 |
| 2005/0184371 | A1 * | 8/2005 | Yang | 257/678 |
| 2006/0220244 | A1 * | 10/2006 | Lu et al. | 257/738 |
| 2007/0271782 | A1 * | 11/2007 | Block et al. | 29/843 |

FOREIGN PATENT DOCUMENTS

| DE | 102004031878 B3 * | 10/2005 |
| JP | 07-074453 | 3/1995 |
| JP | 7-505501 | 6/1995 |
| JP | 2004-087922 | 3/2004 |
| WO | WO 93/19487 | 9/1993 |

OTHER PUBLICATIONS

Japanese Office action mailed Aug. 30, 2011 in counterpart Japanese Patent Application No. 2007-211172.

* cited by examiner

*Primary Examiner* — Minh-Loan T Tran
*Assistant Examiner* — Leslie Pilar Cruz
(74) *Attorney, Agent, or Firm* — Fish & Richardson P.C.

(57) ABSTRACT

A technology is provided for a packaging board adapted to mount a device capable of improving handleability and securing connection reliability. The packaging board includes: a pad electrode formed on a substrate; an insulating layer covering the substrate, having an opening at least in part in an area over the pad electrode; and a joint layer formed on the pad electrode inside the opening. The surface of the joint layer is lower than the top lip of the opening.

16 Claims, 17 Drawing Sheets

100

PACKAGING BOARD, SEMICONDUCTOR MODULE, AND PORTABLE APPARATUS

CROSS-REFERENCE TO RELATED APPLICATIONS

This application is based upon and claims the benefit of priority from the prior Japanese Patent Application No. 2006-234465, filed Aug. 30, 2006, and Japanese Patent Application No. 2007-211172, filed Aug. 13, 2007, the entire contents of which are incorporated herein by reference.

BACKGROUND OF THE INVENTION

1. Field of the Invention

The present invention relates to a packaging board, a semiconductor module, and a portable apparatus.

2. Description of the Related Art

A method for manufacturing a high-density printed circuit board with micropads, having a solder resist between soldering pads with narrow pitches has heretofore been disclosed.

FIG. 17 shows a sectional view of a conventional printed circuit board 500. Soldering pads 52 and a through hole pad 55 are formed on a copper-clad laminate board 51. A solder resist 53 is formed between the soldering pads 52 on the copper-clad laminate plate 51 so as to have openings over the soldering pads 52. A joint layer or solder coating 54 is formed on the soldering pads 52.

In this printed circuit board 500, the solder coating 54 has surfaces higher than the surface of the solder resist 53, and thus protrudes from the surface of the solder resist 53. Since the solder coating 54 protruding in this way impairs the flatness of the printed circuit board 500 at the surface, there has been the problem that the printed circuit board 500 lacks handleability in the steps of handling the printed circuit board 500 listed below.

(1) In the step of lifting the printed circuit board 500 by means of vacuum suction with the vacuum gripper (robot hand) of a vacuum conveyance system, the protrusions of the solder coating 54 create gaps between the suction port of the vacuum gripper and the surface of the printed circuit board 500, thereby hindering vacuum suction. This produces a conveyance error of the printed circuit board 500.

(2) In the step of clamping (fixing) the edges of the printed circuit board 500 with fixing members having a V-grooved structure, the fixing members may come into contact with protrusions of the solder coating 54 formed on the edges of the printed circuit board 500. The printed circuit board 500 can thus be fixed in a tilted state. Namely, it is prevented from being fixed in a proper position.

(3) In the step of packing the printed circuit board 500, the protrusions of the solder coating 54 make the packing unstable when a plurality of printed circuit boards 500 are stacked for package. This also causes an unnecessary increase in volume.

(4) In the step of attaching an auxiliary surface-protecting plate onto the surface of the printed circuit board 500, the protrusions of the solder coating 54 make it difficult to attach the auxiliary plate.

Moreover, in the steps (1) to (4), solder coating 54 coming into contact with other members can be scraped off or cause the adhesion of foreign objects, with a drop in connection reliability.

SUMMARY OF THE INVENTION

The present invention has been achieved in view of the foregoing circumstances, and it is thus a general purpose thereof to provide a packaging board capable of improving handleability and securing connection reliability.

One embodiment of the present invention is a packaging board adapted to mount an electronic device. This packaging board comprises: a pad electrode formed on a substrate; an insulating layer covering the substrate, having an opening at least in part in an area over the pad electrode; and a joint layer formed on the pad electrode inside the opening, wherein the surface of the joint layer lies below a top lip of the opening.

That is, since the surface of the joint layer is lower than the top lip of the opening, the joint layer does not protrude from the insulating layer which constitutes the packaging board. This can ensure the flatness of the surface of the packaging board, thereby improving handleability in subsequent handling steps (such as the mounting of circuit devices). Furthermore, because the joint layer does not protrude from the surface of the insulating layer, it is possible to reduce the chance of contact with other members and beneficially protect the joint layer. This can secure the connection reliability. In addition to this, since the joint layer can be provided in a smaller volume than heretofore, it is possible to save on the cost of the material for making the joint layer.

In the foregoing embodiment, if r is smaller than a, then a difference d between a thickness of the insulating layer and a thickness of the joint layer may satisfy a relational expression $d \leq r - (r^2 - a^2)^{1/2}$, where r is a radius of curvature of a solder ball corresponding to the joint layer, formed on a circuit device to be mounted, and a is a radius of the opening. Moreover, the surface of the pad electrode may be plated with nickel and gold.

Another embodiment of the present invention is a packaging board adapted to mount an electronic device. This packaging board comprises: a pad electrode formed on a substrate; an insulating layer covering the substrate, having an opening at least in part in an area over the pad electrode; and a joint layer formed on the pad electrode inside the opening, wherein the opening has a side convexly curved toward the joint layer.

In the foregoing embodiment, the opening may increase in radius toward the top. The surface of the joint layer may be lower than a top lip of the opening. Furthermore, a tangent to a lowermost part of a side of the opening and the surface of the joint layer may form an angle greater than the angle of contact of the joint layer onto the pad electrode. The surface of the pad electrode may be plated with nickel and gold.

Yet another embodiment of the present invention is a semiconductor module. This semiconductor module comprises the packaging board according to any one of the foregoing embodiments, and a circuit device having a solder bump, the joint layer and the solder bump being joined to each other.

Yet another embodiment of the present invention is a portable apparatus. This portable apparatus comprises the semiconductor module described above.

It is to be noted that any arbitrary combination or rearrangement of the above-described structural components and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
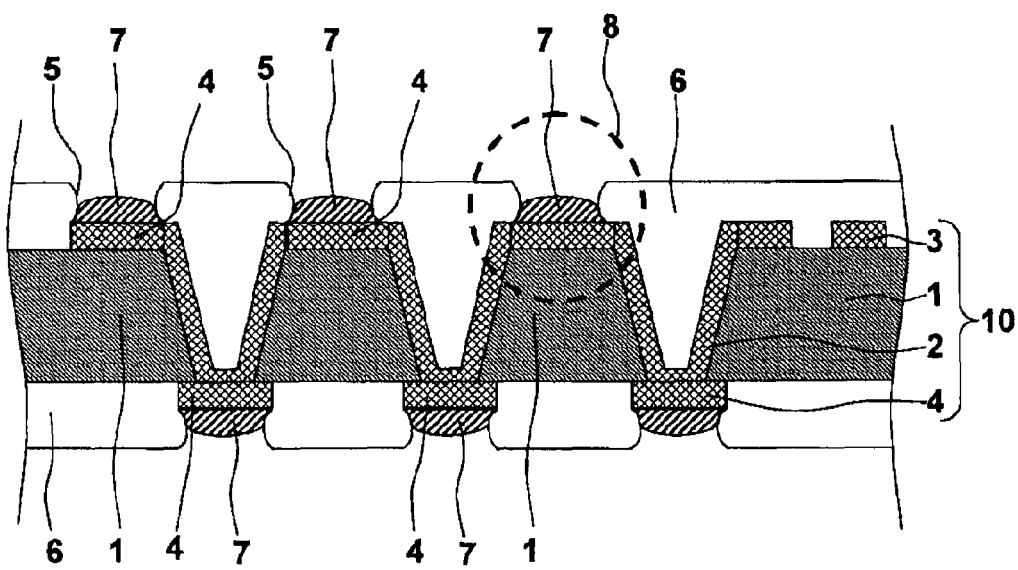
FIG. 1 is a sectional view of a packaging board adapted to mount an electronic device according to a first embodiment of the present invention.

The invention will now be described by reference to the preferred embodiments. This does not intend to limit the scope of the present invention, but to exemplify the invention.

First Embodiment

Hereinafter, a first embodiment of the packaging board according to the present invention will be described with reference to FIGS. 1 and 2.

Initially, referring to FIG. 1, the structure of the packaging board 100 according to the present embodiment will be described in detail. FIG. 1 shows a cross-sectional view of the packaging board 100. A substrate 1 is provided with wiring parts 2. A wiring pattern 3 and pad electrodes 4 made of copper (Cu) are formed on the surface of the substrate 1. The pad electrodes 4 are electrically connected to the wiring parts 2. A wiring board 10 is composed of the substrate 1, the wiring parts 2, the wiring pattern 3, and the pad electrodes 4 mentioned above.

The surface of the wiring board 10 is coated with a solder resist layer 6. Openings 5 are formed in the solder resist layer 6 at positions corresponding to the top surfaces of the pad electrodes 4. The solder resist layer 6 functions as a protective coating for the wiring parts 2 and the wiring pattern 3. The solder resist layer 6 is made of a thermosetting resin such as epoxy resin.

In addition, $SiO_2$ or other fillers may be added to the solder resist layer 6. Solder bumps 7 made of a brazing material such as tin(Sn)-silver(Ag)-copper(Cu) type solder are formed on the pad electrodes 4.

Figure 2:
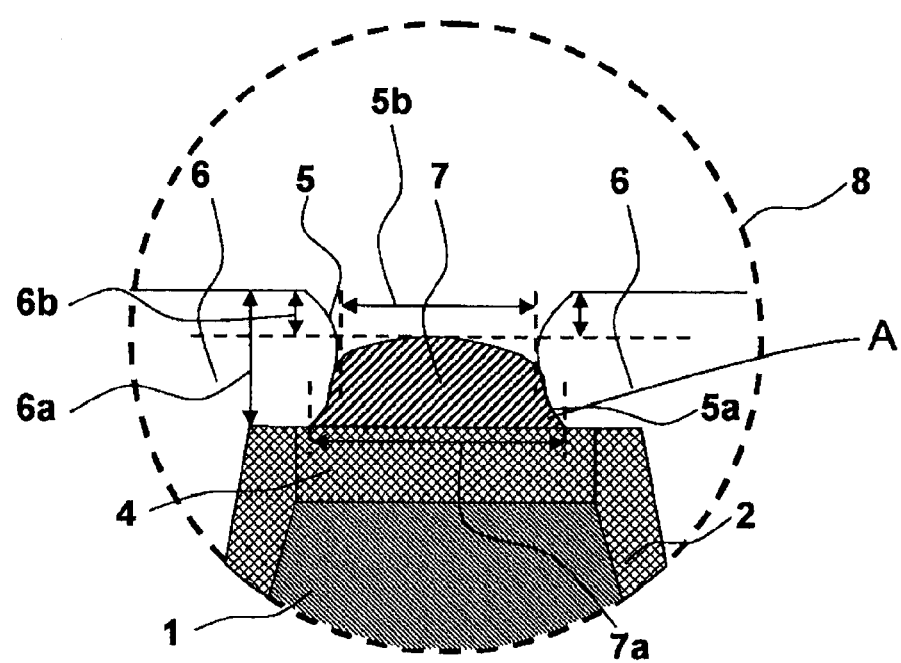
FIG. 2 is an enlarged view of a part of the packaging board according to the first embodiment.
Figure 3A:
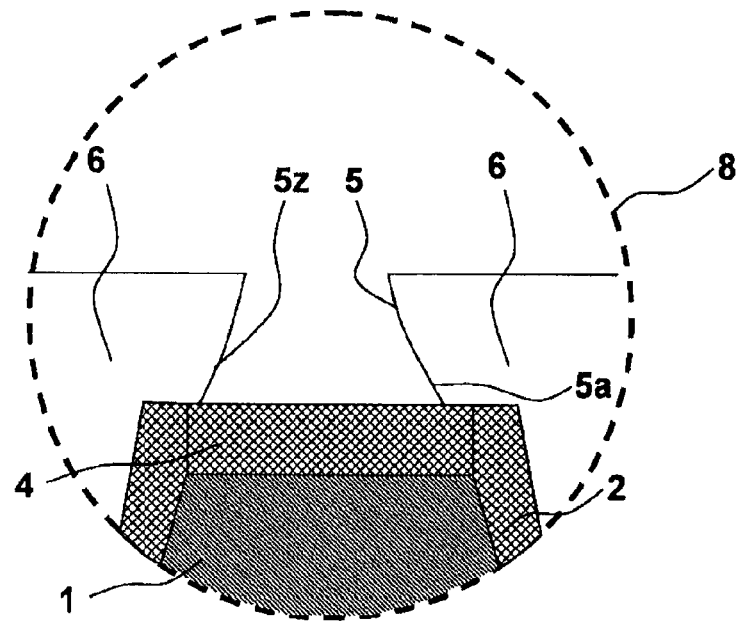
FIGS. 3A and 3B are sectional views showing the steps for manufacturing the packaging board according to the first embodiment.
Figure 3B:
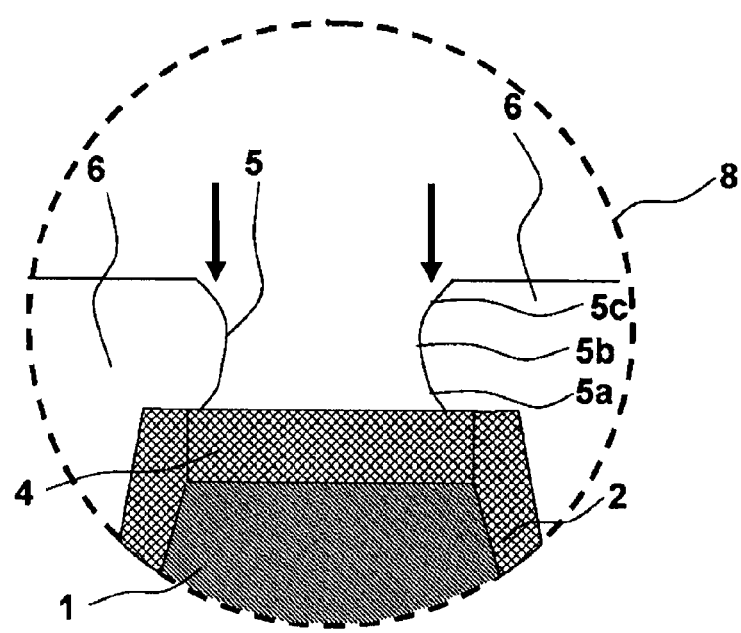
Figure 4A:
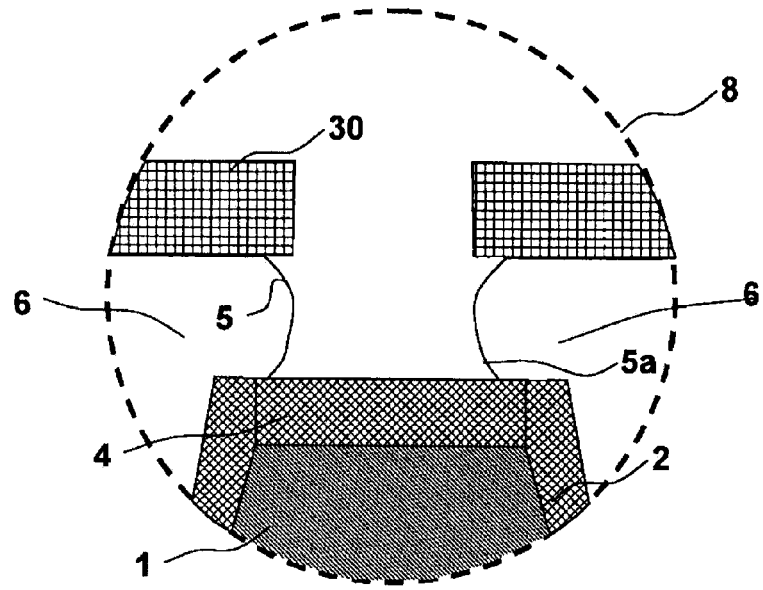
FIGS. 4A and 4B are sectional views showing the steps for manufacturing the packaging board according to the first embodiment.
Figure 4B:
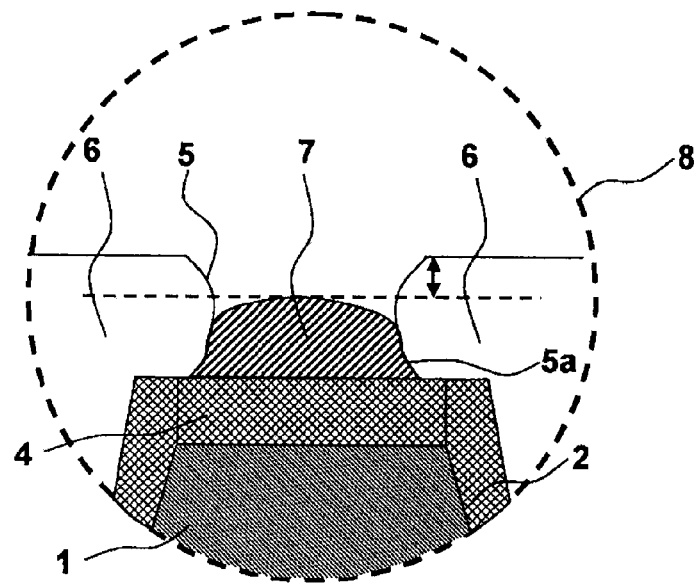

FIG. 2 shows an enlarged view of an area 8 in FIG. 1. In the present embodiment, the solder bump 7 is formed so that the surface of the solder bump 7 lies below the top lip of the opening 5. The sides of the opening 5 in the solder resist layer 6 have a structure convexly curved toward the solder bump 7. Specifically, the bottom area of the solder bump 7 has a diameter 7a of approximately 100 μm, and the sides of the opening 5 have a diameter of approximately 80 μm at the narrowest area 5b. The solder resist layer 6 has a height 6a of approximately 25 μm from the surface of the pad electrode 4. The height 6b from the top of the solder bump 7 to the surface of the solder resist layer 6 is approximately 8 μm.

Next, the steps of manufacturing the structures in the area 8 shown in FIG. 2 will be described with reference to FIGS. 3A to 4B.

Step A (see FIG. 3A) Using a photosensitive resin as the solder resist, a film of solder resist layer 6 is bonded (laminated) onto the entire surface of the substrate, and then portions other than that where the opening 5 is to be made are exposed to light. Subsequently, development is performed using a sodium carbonate aqueous solution, for example. This removes the unexposed area of the photo solder resist alone, thereby forming the opening 5. Next, heat processing is performed for curing. Ultraviolet rays of 365 nm in wavelength are suitably used as the light source for irradiating the substrate. Exposure using this light source forms an opening 5 having an inversely tapered sectional shape 5z.

Step B (see FIG. 3B) A suspension containing alumina particle grains is sprayed onto the arrowed positions on the substrate surface. This processing trims the tapered areas of the opening 5a having the inverse tapered shape 5z, whereby the sides of the opening 5 are formed into a curved shape (convex portion 5b, and recessed portions 5a and 5c).

Step C (see FIG. 4A) A solder paste made by mixing solder particles with a flux is filled into the opening 5 by screen printing, using a metal plate 30 having an opening in the position corresponding to the opening 5 as a mask on the surface of the solder resist layer 6. The solder particles may be alloys of tin (Sn), silver (Ag), copper (Cu), and the like. A flux composed of rosin as a main component may be used.

Step D (see FIG. 4B) The substrate is heated up to the solder melting point, thereby melting the solder particles to form a solder bump 7. The melted solder particles fill into the recessed portions 5a of the curved opening 5 in the solder resist layer 6. Here, the flux content can be set to be higher than 10% by weight, a value in common use, so that the proportion of solder particles included in an identical volume of solder paste is decreased. This can reduce the thickness of the solder bump 7 formed after the heating. The high flux content also lowers the surface tension, thereby shaping the solder bump 7 into a smooth surface. This makes it possible to reduce the height of the solder bump 7.

It should be appreciated that in the present embodiment, the substrate 1 is an example of the "substrate" of the present invention, the pad electrodes 4 is an example of the "pad electrode" of the present invention, the openings 5 is an example of the "opening" of the present invention, the solder resist layer 6 is an example of the "insulating layer" of the present invention, and the solder bumps 7 is an example of the "joint layer" of the invention.

As has been described, the packaging board according to the present embodiment can provide the following effects.

(1) Since the solder bumps 7 do not protrude from the surface of the solder resist layer 6, it is possible to secure the flatness of the packaging board 100 at the surface and improve the handleability of the packaging board 100.

(2) The openings 5 have the sides with a convexly curved structure toward the solder bumps 7. The melted solder bumps 7 thus fill into skirt areas 5a of the convexly curved structure, i.e., the skirt areas 5a on the side of the pad electrodes 4. Consequently, the solder bumps 7 are fixed by the skirt areas 5a. This increases the fixing strength between the solder bumps 7 and the pad electrodes 4, and can prevent the solder bumps 7 from exfoliating from the pad electrodes 4.

The packaging board 100 also desirably has the following structure.

(Side Shape of the Solder Resist Layer)

Figure 5A:
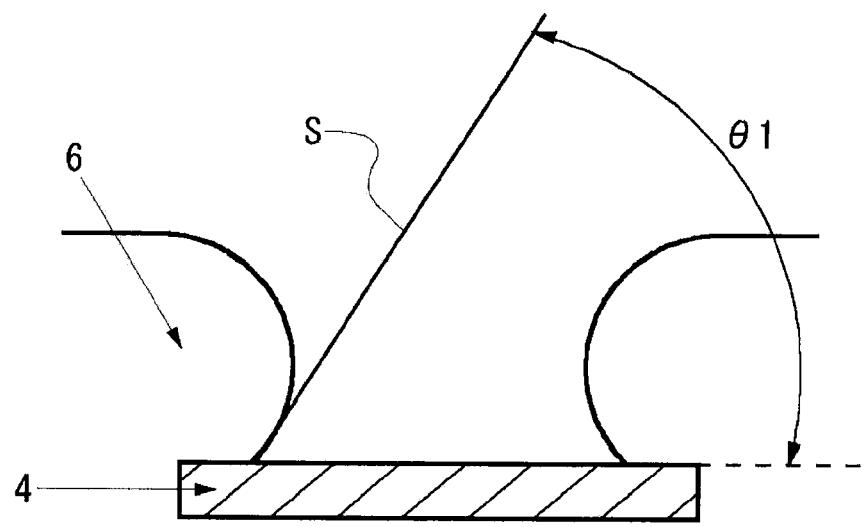
FIG. 5A is a diagram showing the shape of a side of a solder resist layer in the packaging board.
Figure 5B:
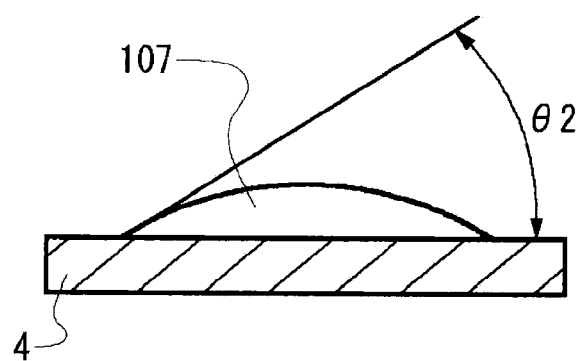
FIG. 5B is a diagram showing the contact angle of solder to be used for a solder bump.

FIG. 5A shows the shape of the sides of the solder resist layer 6 in the packaging board 100. FIG. 5B shows the contact angle of solder 107 to be used for a solder bump. It is desirable that a tangent S to the lowermost part of a side of the solder resist layer 6 and the surface of the pad electrode 4 forms an angle ($\theta 1$: see FIG. 5A) greater than the contact angle ($\theta 2$: see FIG. 5B) between the pad electrode 4 and the solder 107 that forms the solder bump. That is, $\theta 1$ pertaining to the side shape of the solder resist layer 6 desirably satisfies the relationship of $\theta 1 > \theta 2$.

Incidentally, the contact angle $\theta 2$ of the solder 107 is determined by melting solder on a substrate made of the same material as that of the pad electrodes 4, and measuring the angle between the surface of the substrate and the solder when solidified by air cooling.

According to the foregoing configuration, the solder fills into the gaps (area A in FIG. 2) between the solder resist layer 6 and the pad electrodes 4 without fail, thereby improving the connection reliability of the electrodes.

Nickel-gold plating such as Ni—Au plating and Ni—Pd—Au plating may be applied to the surfaces of the pad electrodes 4 for improved wettability with solder. This can decrease the contact angle $\theta 2$ of the solder. Consequently, the solder fills into the gaps (area A in FIG. 2) between the solder resist layer 6 and the pad electrodes 4 without fail, thereby improving the connection reliability of the electrodes further. Since $\theta 1$ can be decreased with the decreasing contact angle $\theta 2$, it is possible to shape the solder resist layer 6 for higher connection strength.

Figure 6A:
FIGS. 6A and 6B are diagrams showing the shapes of solder when Sn—Ag—Cu type solder is heated to 250° C. in an air atmosphere for 30 seconds to melt on the surface of a Cu substrate that is surface-treated with Ni—Au and on the surface of a Cu-surface substrate, respectively, followed by air cooling.
Figure 6B:
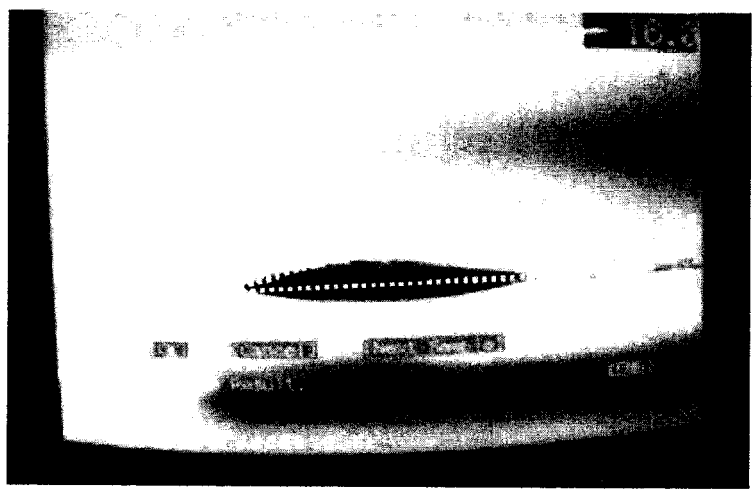

FIGS. 6A and 6B show the shapes of solder when Sn—Ag—Cu type solder is heated to 250° C. in an air atmosphere for 30 seconds to melt on the surface of a Cu-surface substrate and on the surface of a Cu substrate that is surface-treated with Ni—Au, respectively, followed by air cooling. By measurement, these solder shapes showed $\theta 2 = 16°$ on the Ni—Au surface-treated substrate and 25.3° on the Cu-surface substrate. In this way, the application of Ni—Au surface treatment to the surfaces of the pad electrodes can decrease the contact angle of the solder effectively.

(Thickness of Solder Bumps)

The solder bumps 7 are desirably formed into a thickness such that when mounted on an LSI chip to be mounted, the solder bumps 7 and the solder balls formed on the LSI chip make contact with each other. This makes it easier for the solder bumps 7 and the solder balls on the LSI chip to be integrated when melting the solder, thereby improving the alignment accuracy by means of self alignment due to the surface tension of the solder.

Figure 7:
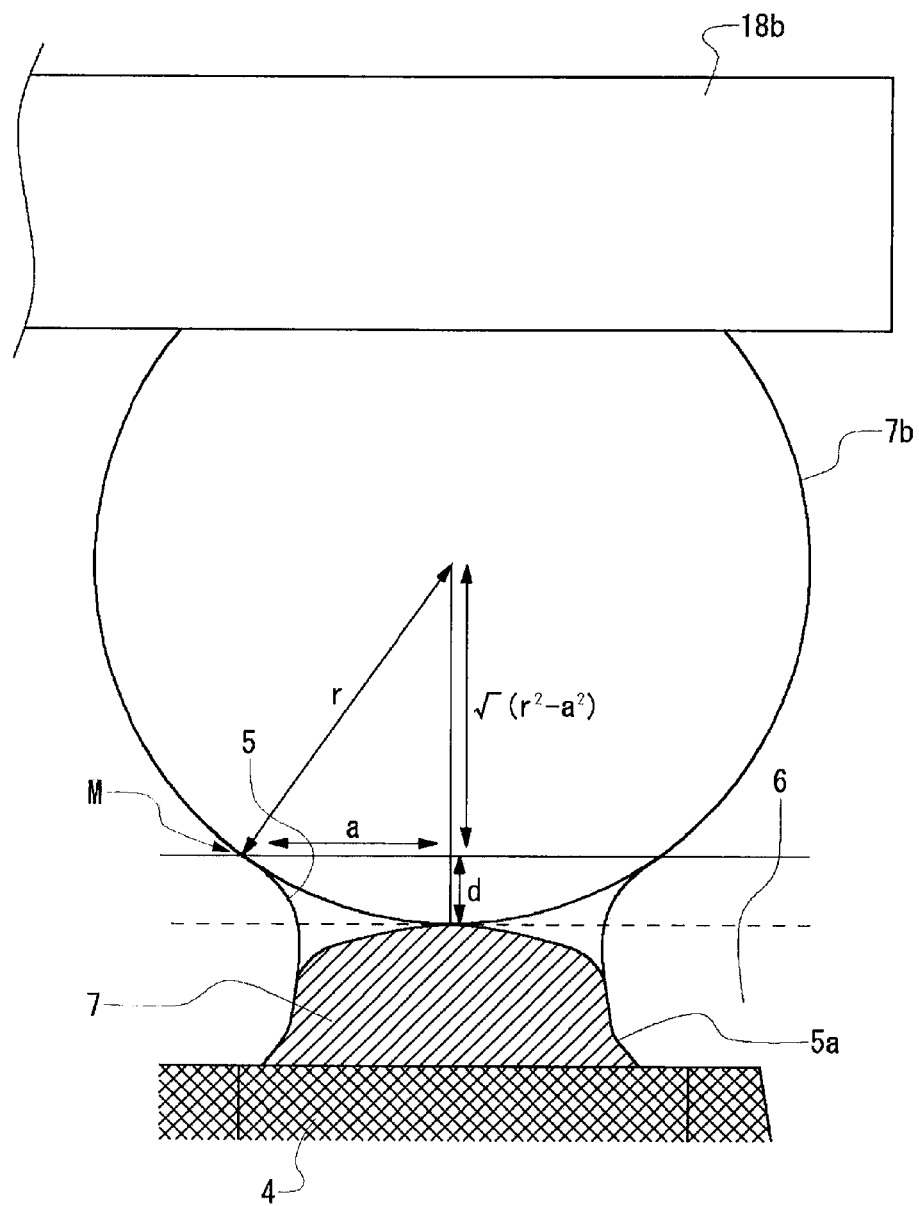
FIG. 7 is a diagram showing the thickness of a solder bump suitable for mounting an LSI chip.

Now, the desired thickness of the solder bumps 7 will be described specifically. Initially, as shown in FIG. 7, r, a, and d will be defined as follows:

r: the radius of a solder ball 7b formed on an LSI chip 18b;

a: the radius of an opening in the solder resist layer 6 in contact with the solder ball 7b formed on the LSI chip 18b; and d: the vertical distance from a contact M between the solder ball 7b formed on the LSI chip 18b and the solder resist layer 6 to the top of the surface of the solder bump 7.

When a<r:

In this case, the solder bump 7 and the solder ball 7b on the LSI chip 18b make contact if the following relational expression holds:

$$d \leq r - (r^2 - a^2)^{1/2}.$$

That is, the solder bump 7 desirably has a thickness sufficient to satisfy the foregoing relational expression.

When a≧r:

In this case, the solder ball 7b on the LSI chip 18b can fit into the opening of the solder resist layer 6, and thus the solder bump 7 and the solder ball 7b on the LSI chip 18b always make contact. This requires only that the solder bump 7 have a thickness less than that of the solder resist layer 6.

Second Embodiment

A description will now be given of a second embodiment of the packaging board according to the present invention. The packaging board of the present embodiment also has a basic structure conforming to the packaging board of the foregoing first embodiment. A difference, however, consists in that the packaging board according to the present embodiment has a plurality of wiring boards. This packaging board will be described with reference to FIG. 8. It should be noted that the same or similar structures as in the foregoing first embodiment will be designated by like reference numerals, and detailed description thereof will be omitted.

Figure 8:
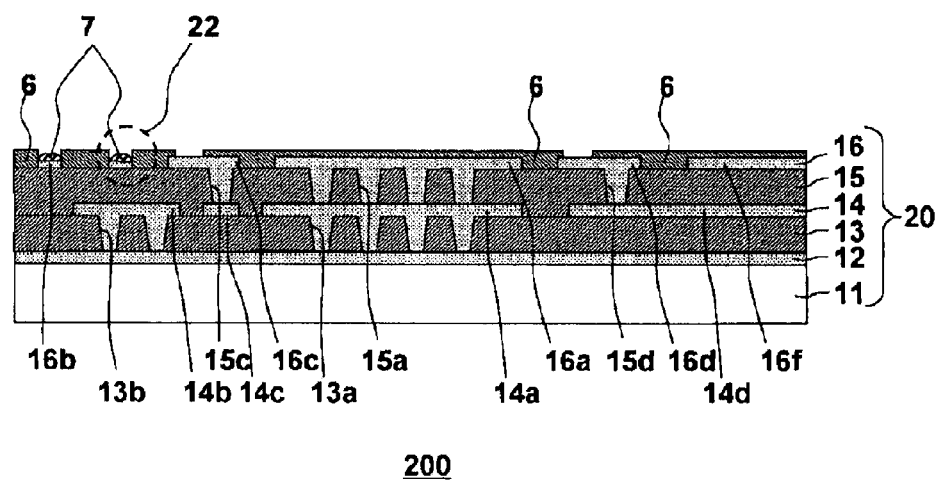
FIG. 8 is a sectional view of the packaging board according to a second embodiment of the present invention.

FIG. 8 shows a cross-sectional view of the packaging board 200. A multilayered wiring board 20 is composed of a substrate 11, insulating layers 13 and 15, and conductive layers 12, 14, and 16. The conductive layer 12 made of copper (Cu) is formed on the substrate 11. A first insulating layer 13 consisting mainly of epoxy resin, having a thickness of approximately 60 to 160 μm, is formed on the surface of the conductive layer 12.

Four via holes 13a and two via holes 13b having a diameter of approximately 100 μm are formed through the insulating layer 13 at predetermined areas of the insulating layer 13 beneath an LSI chip 18a to be described later. Then, a first conductive layer 14 of copper having a thickness of approximately 15 μm, including a thermal via part 14a and wiring parts 14b to 14d, is formed on predetermined areas of the insulating layer 13. The thermal via part 14a of the conductive layer 14 is arranged in an area beneath the LSI chip 18a, and has portions embedded in the via holes 13a so as to make contact with the surface of the conductive layer 12.

A second insulating layer 15 having the same thickness and composition as those of the foregoing first insulating layer 13 is formed so as to cover the conductive layer 14. Moreover, a second conductive layer 16 of copper (Cu) having the same thickness as that of the foregoing first conductive layer 14 is formed on predetermined areas of the insulating layer 15.

Specifically, four via holes 15a having a diameter of approximately 100 μm are formed through the insulating layer 15 at predetermined areas of the insulating layer 15 beneath the LSI chip 18a. These four via holes 15a are formed at positions corresponding to the respective four via holes 13a. In addition, via holes 15c and 15d having a diameter of approximately 100 μm are formed through the insulating layer 15 at predetermined areas of the insulating layer 15 corresponding to the wiring parts 14c and 14d of the conductive layer 14.

The conductive layer 16 includes a thermal via part 16a, wire bonding parts 16c and 16d, and wiring parts 16b and 16f. The thermal via part 16a of the conductive layer 16 is arranged in an area beneath the LSI chip 18a, and has portions embedded in the via holes 15a so as to make contact with the surface of the thermal via part 14a of the conductive layer 14. The thermal via part 16a of this conductive layer 16 has the function of conducting heat emanating from the LSI chip 18a to the thermal via part 14a of the conductive layer 14 for heat dissipation.

The wire bonding parts 16c and 16d of the conductive layer 16 are arranged in areas corresponding to the via holes 15c and 15d, respectively, and have portions embedded in the via holes 15c and 15d so as to make contact with the surfaces of the wiring parts 14c and 14d of the conductive layer 14. It should be noted that the wiring part 16b of the conductive layer 16 is arranged in an area beneath an LSI chip 18b to be described later.

As above, the multilayered wiring board 20 is composed of the substrate 11, the insulating layers 13 and 15, and the conductive layers 12, 14, and 16.

A solder resist layer 6 is formed so as to cover the conductive layer 16 of the multilayered wiring board 20, with openings in areas corresponding to the wire bonding parts 16c and 16d and the wiring part 16b of the conductive layer 16. The solder resist layer 6 functions as a protective coating for the conductive layer 16. The solder resist layer 6 is made of a thermosetting resin such as a melamine derivative, liquid crystal polymer, epoxy resin, PPE (polyphenylene ether) resin, polyimide resin, fluorocarbon resin, phenol resin, or polyamide bismaleimide. It should be appreciated that liquid crystal polymer, epoxy resin, and melamine derivatives have excellent high-frequency characteristics, and thus are preferred materials of the solder resist layer 6. $SiO_2$ or other fillers may also be added to the solder resist layer 6.

The LSI chip 18b to be described later is mounted on the wiring part 16b of the conductive layer 16 via a joint layer 7 made of a brazing material such as solder, and is electrically connected to the wiring part 16b with the joint layer 7.

Figure 9:
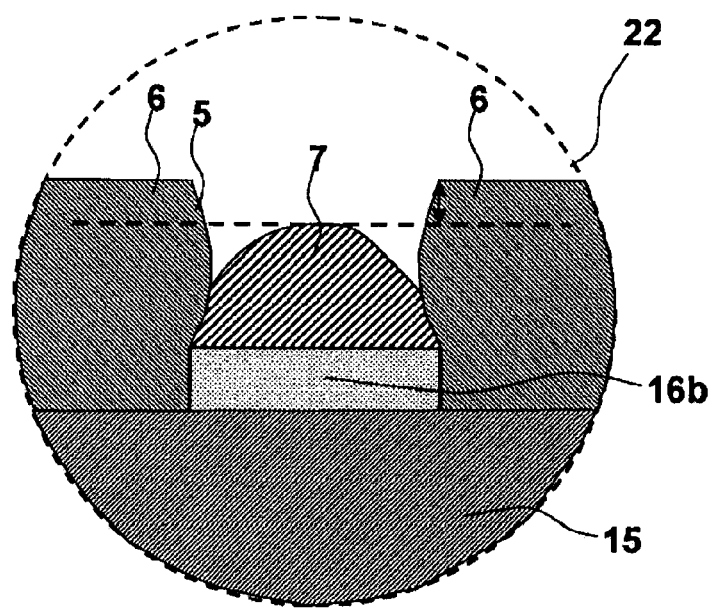
FIG. 9 is an enlarged view of a part of the packaging board according to the second embodiment.
Figure 10A:
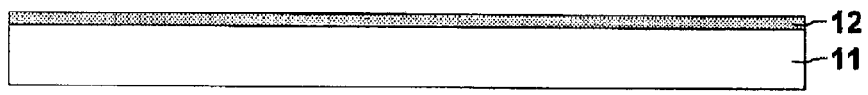
FIGS. 10A to 10E are sectional views showing the steps for manufacturing the packaging board according to the second embodiment.
Figure 10B:
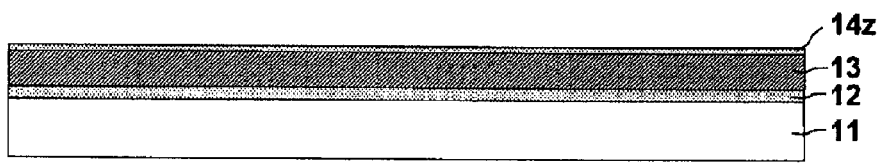
Figure 10C:
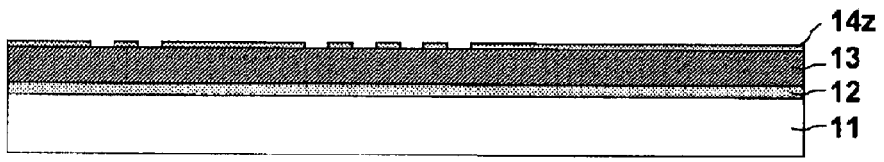
Figure 10D:
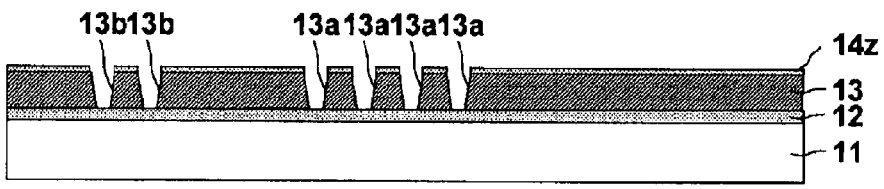
Figure 10E:
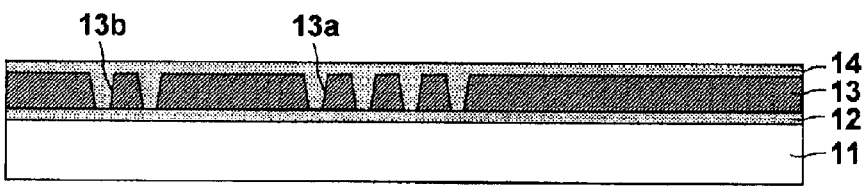
Figure 11A:
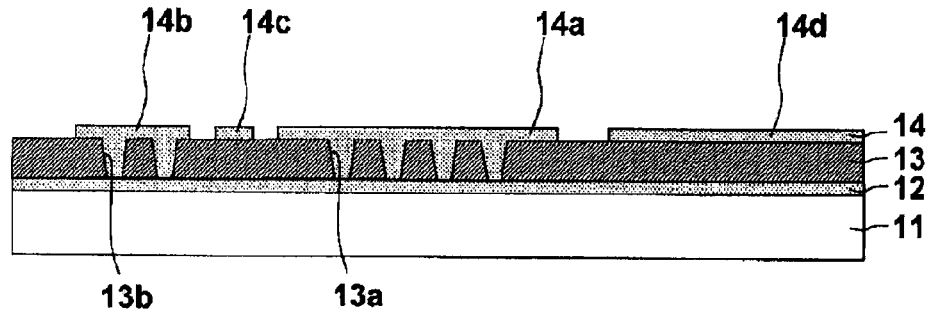
FIGS. 11A to 11D are sectional views showing the steps for manufacturing the packaging board according to the second embodiment.
Figure 11B:
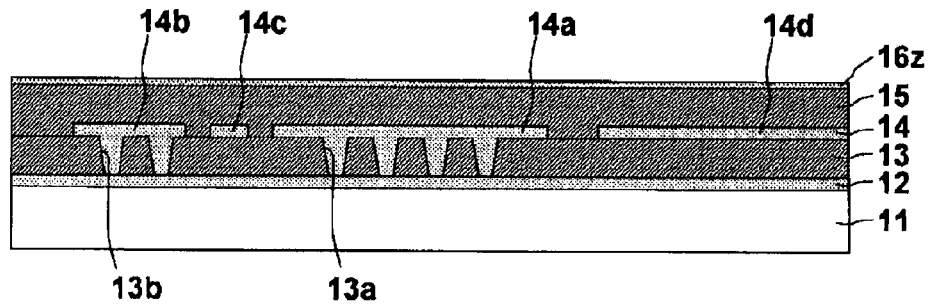
Figure 11C:
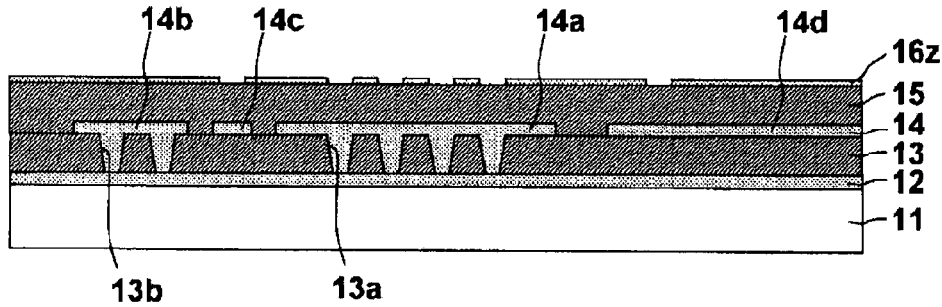
Figure 11D:
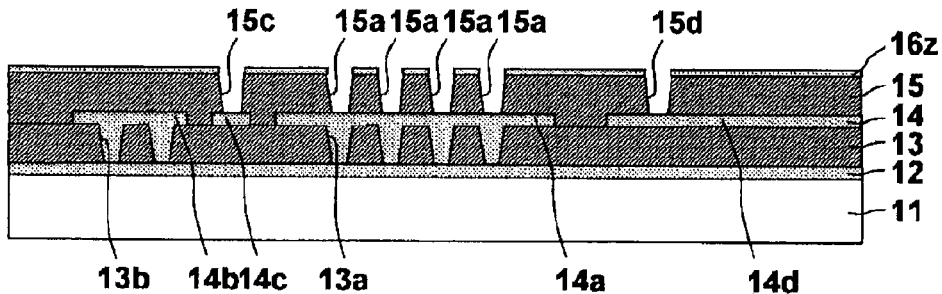
Figure 12A:
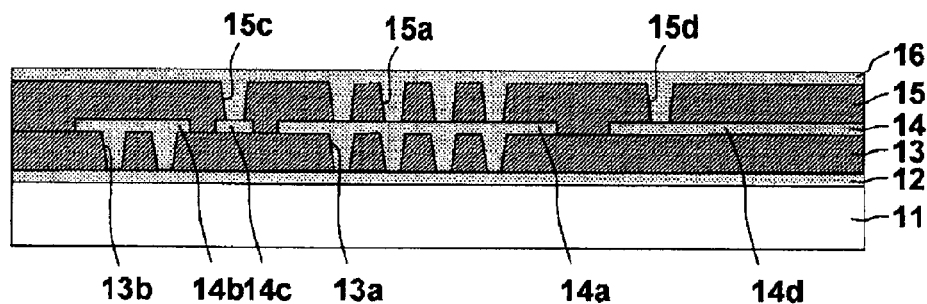
FIGS. 12A to 12C are sectional views showing the steps for manufacturing the packaging board according to the second embodiment.
Figure 12B:
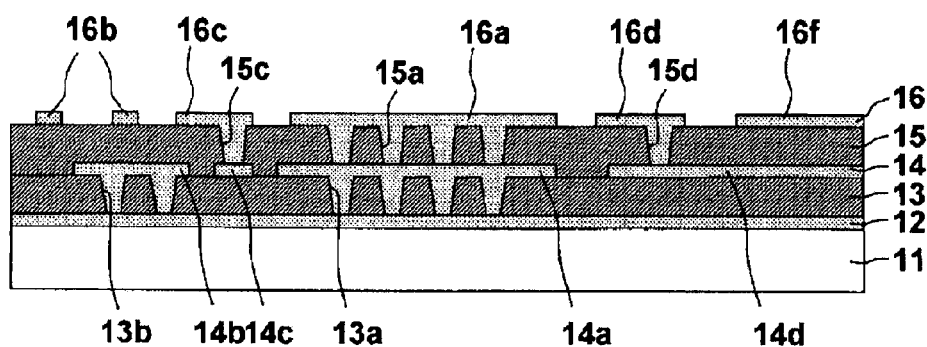
Figure 12C:
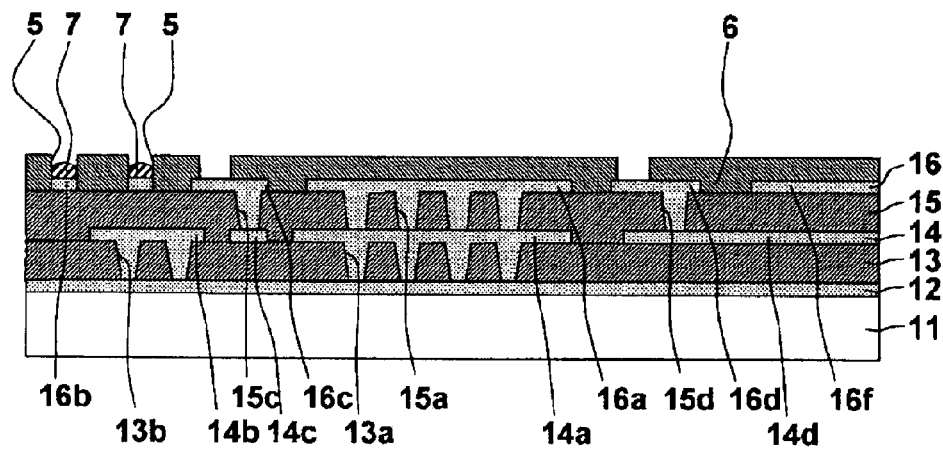

FIG. 9 shows an enlarged view of an area 22 in FIG. 8. As in FIG. 2 of the first embodiment, the surface of the joint layer 7 lies below the top lip of the opening 5 in the solder resist layer 6.

In the present embodiment, the substrate 11 is an example of the "substrate" of the present invention, the wiring part 16b is an example of the "pad electrode" of the present invention, and the joint layer 7 is an example of the "joint layer" of the present invention.

Figure 13A:
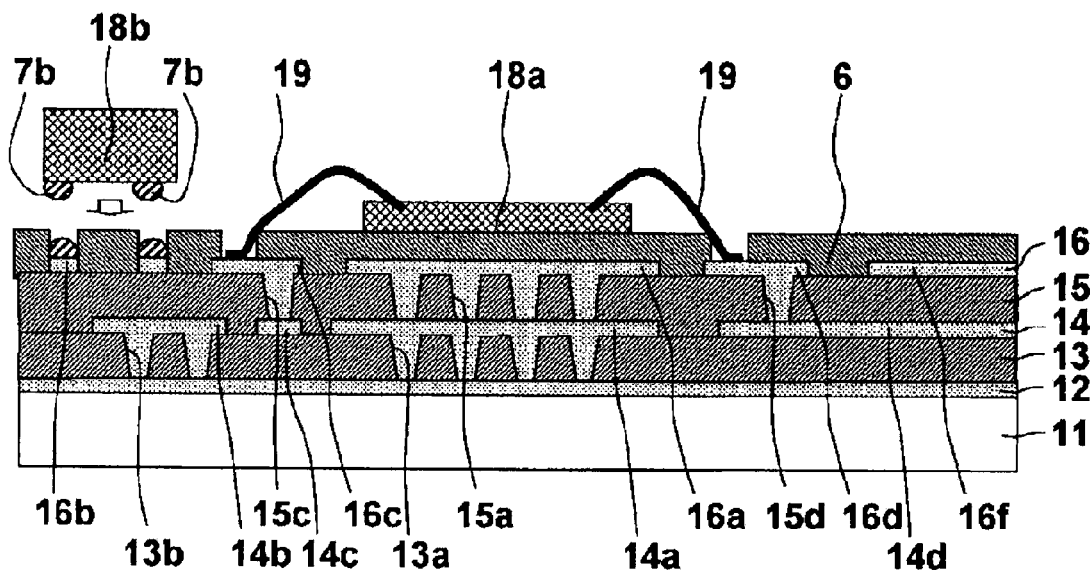
FIGS. 13A and 13B are sectional views showing the steps for manufacturing the packaging board according to the second embodiment.
Figure 13B:
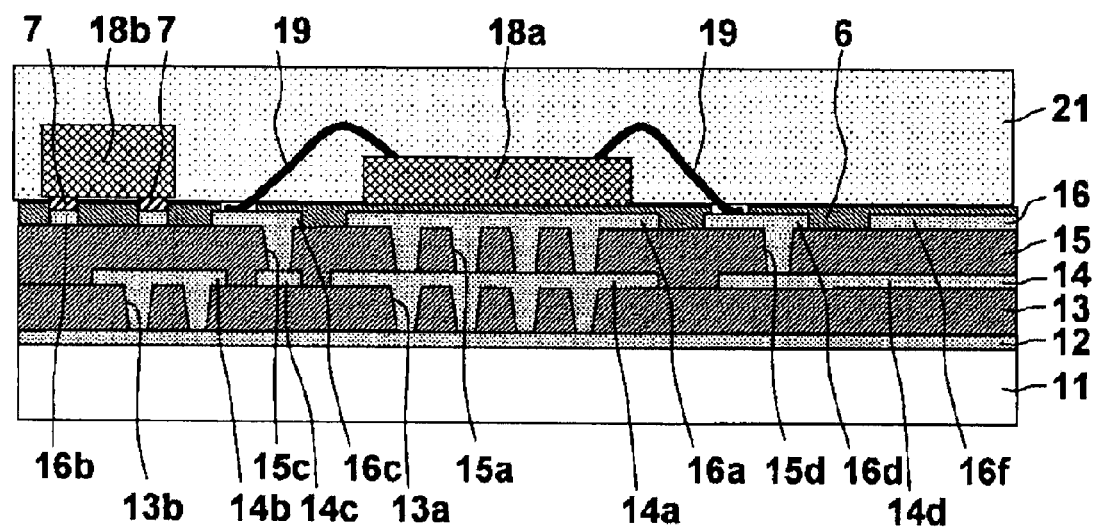

FIGS. 10A to 12C are sectional views for explaining the process of manufacturing the packaging board 200 according to the present embodiment shown in FIG. 8. FIGS. 13A and 13B are sectional views for explaining the manufacturing process for mounting LSI chips and chip resistors on the device mounting substrate 200 and sealing the mounted packaging board 200 with resin. With reference to FIGS. 10A to 12C, a description will now be given of the process of manufacturing the device mounting substrate according to the present embodiment.

Step 1 (see FIG. 10A) A substrate 11 having a conductive layer 12 of copper (Cu) is prepared. The substrate 11 may be made of a material that can be exfoliated from the conductive layer 12 after the formation of the multilayered wiring board 20 (see FIG. 8). For example, a PET film may be used as this material.

Step 2 (see FIG. 10B) Epoxy resin having an alumina, silica, or other fillers added thereto is applied to the surface of the conductive layer 12, thereby forming an insulating layer 13 having a thickness of approximately 60 to 160 μm. Subsequently, copper foil 14z having a thickness of approximately 3 μm is attached to the insulating layer 13 by pressure.

Step 3 (see FIG. 10C) Using photolithographic technology and etching technology, the copper foil 14z is removed from locations over the areas where the via holes 13a and 13b are to be formed (see FIG. 8). This exposes the areas of the insulating layer 13 where the via holes 13a and 13b are to be formed.

Step 4 (see FIG. 10D) The copper foil 14z is irradiated with carbon dioxide gas laser or UV laser from above, whereby the insulating layer 13 is removed from the exposed areas, from the exposed surfaces down to the conductive layer 12. This forms the four via holes 13a and the two via holes 13b through the insulating layer 13, with a diameter of approximately 100 μm. The via holes 13a are formed in order to make the thermal via parts 14a to be described later.

Step 5 (see FIG. 10E) The top surface of the copper foil 14z and the inner surfaces of the via holes 13a and 13b are plated with copper to a thickness of approximately 0.5 μm by electroless plating. Subsequently, the top surface of the copper foil 14z and the interiors of the via holes 13a and 13b are plated by electrolytic plating. In the present embodiment, inhibitors and promoters are added to the plating solution so that the inhibitors are absorbed onto the top surface of the copper foil 14z while the promoters are absorbed onto the inner surfaces of the via holes 13a and 13b.

This can increase the thickness of the copper plating on the inner surfaces of the via holes 13a and 13b, thereby filling the via holes 13a and 13b with copper. As a result, the conductive layer 14 having a thickness of approximately 15 μm is formed on the insulating layer 13, and the conductive layer 14 is embedded in the via holes 13a and 13b as well.

Step 6 (see FIG. 11A) The conductive layer 14 is patterned using photolithographic technology and etching technology. This forms the thermal via part 14a lying in the area beneath the LSI chip 18a to be described later, and the wiring parts 14b to 14d.

Step 7 (see FIG. 11B) Epoxy resin having an alumina, silica, or other fillers added thereto is applied so as to cover the conductive layer 14, thereby forming an insulating layer 15 having a thickness of approximately 60 to 160 μm. Subsequently, copper foil 16z having a thickness of approximately 3 μm is attached to the insulating layer 15 by pressure.

Step 8 (see FIG. 11C) Using photolithographic technology and etching technology, the copper foil 16z is removed from locations over the areas where the via holes 15a, 15c, and 15d are to be formed (see FIG. 8). This exposes the areas of the insulating layer 15 where the via holes 15a, 15c, and 15d are to be formed.

Step 9 (see FIG. 11D) The copper foil 16z is irradiated with carbon dioxide gas laser or UV laser from above, whereby the insulating layer 15 is removed from the exposed areas, from the exposed surfaces down to the surface of the conductive layer 14. This forms four via holes 15a through the insulating layer 15, with a diameter of approximately 100 μm. In this step, via holes 15c and 15d having a diameter of approximately 100 μm are also formed through the insulating layer 15 at the same time.

Step 10 (see FIG. 12A) The top surface of the copper foil 16z and the inner surfaces of the via holes 15a, 15c, and 15d are plated with copper to a thickness of approximately 0.5 μm by electroless plating. Subsequently, the top surface of the copper foil 16z and the interiors of the via holes 15a, 15c, and 15d are plated by electrolytic plating. Here, inhibitors and promoters are added to the plating solution so that the inhibitors are absorbed onto the top surface of the copper foil 16z while the promoters are absorbed onto the inner surfaces of the via holes 15a, 15c, and 15d.

This can increase the thickness of the copper plating on the inner surfaces of the via holes 15a, 15c, and 15d, thereby filling the via holes 15a, 15c, and 15d with copper. As a result, the conductive layer 16 having a thickness of approximately 15 μm is formed on the insulating layer 15, and the conductive layer 16 is embedded and filled into the via holes 15a, 15c, and 15d as well.

Step 11 (see FIG. 12B) The conductive layer 16 is patterned using photolithographic technology and etching technology. This forms the thermal via part 16a lying in the area beneath the LSI chip 18a to be described later, the wire bonding parts 16c and 16d lying in areas at predetermined distances from the ends of the thermal via 16a; the wiring part 16b lying in the area beneath the LSI chip 18b to be described later; and the wiring part 16f lying in the area beneath a lead (not shown).

Step 12 (see FIG. 12C) A solder resist layer 6 is formed so as to cover the conductive layer 16, with openings 5 in the areas corresponding to the wiring part 16b and the wire bonding parts 16c and 16d of the conductive layer 16. The solder resist layer is formed by the same method as in steps A and B described in the first embodiment. A joint layer 7 made of a brazing material such as solder is also formed on the wiring parts 16b of the conductive layer 16. The joint layer 7 is formed by the same method as in steps C and D described in the first embodiment. As shown in FIG. 6, this joint layer 7 is formed so that its surface is lower than the surface of the solder resist layer 6. The joint layer 7 thus will not protrude from the surface of the solder resist layer 6.

Through the foregoing steps, the packaging board 200 according to the present embodiment shown in FIG. 8 is fabricated.

Then, circuit devices are mounted on the packaging board 200 by the following steps. The resultant apparatus may be sealed with resin.

Step 13 (see FIG. 13A) The LSI chip 18a is mounted on the solder resist layer 6 over the thermal via part 16a of the conductive layer 16, via an adhesive layer (not shown) made of epoxy resin with a thickness of approximately 50 μm. The thickness of the adhesive layer after the mounting of this LSI chip 18a is approximately 20 μm. Subsequently, the LSI chip 18a and the wire bonding parts 16c and 16d of the conductive layer 16 are electrically connected with wires 19.

The LSI chip 18b is also arranged so that the connection terminals of the LSI chip 18b, or the solder balls 7b, make contact with the joint layer 7 on the wiring parts 16b. Heat treatment is applied to make the joint layer 7 and the solder balls 7b into a paste form, and the LSI chip 18b is mounted onto the packaging board. This electrically connects the LSI chip 18b to the wiring parts 16b through the joint layer 7.

Step 14 (see FIG. 13B) For the purpose of protecting the LSI chips 18a and 18b, a sealing resin layer 21 made of epoxy resin is formed so as to cover the LSI chips 18a and 18b. Consequently, a semiconductor module having the circuit devices mounted on the packaging board 200 is obtained.

As has been described, the packaging board according to the present embodiment provides the following effect.

(3) Since the surface of the joint layer 7 is lower than that of the solder resist layer 6, it creates recesses for facilitating positioning when mounting circuit devices like the LSI chip 18b onto the packaging board, which have solder balls 7b or other such pins intended for connection with a packaging board.

Third Embodiment

Figure 14:
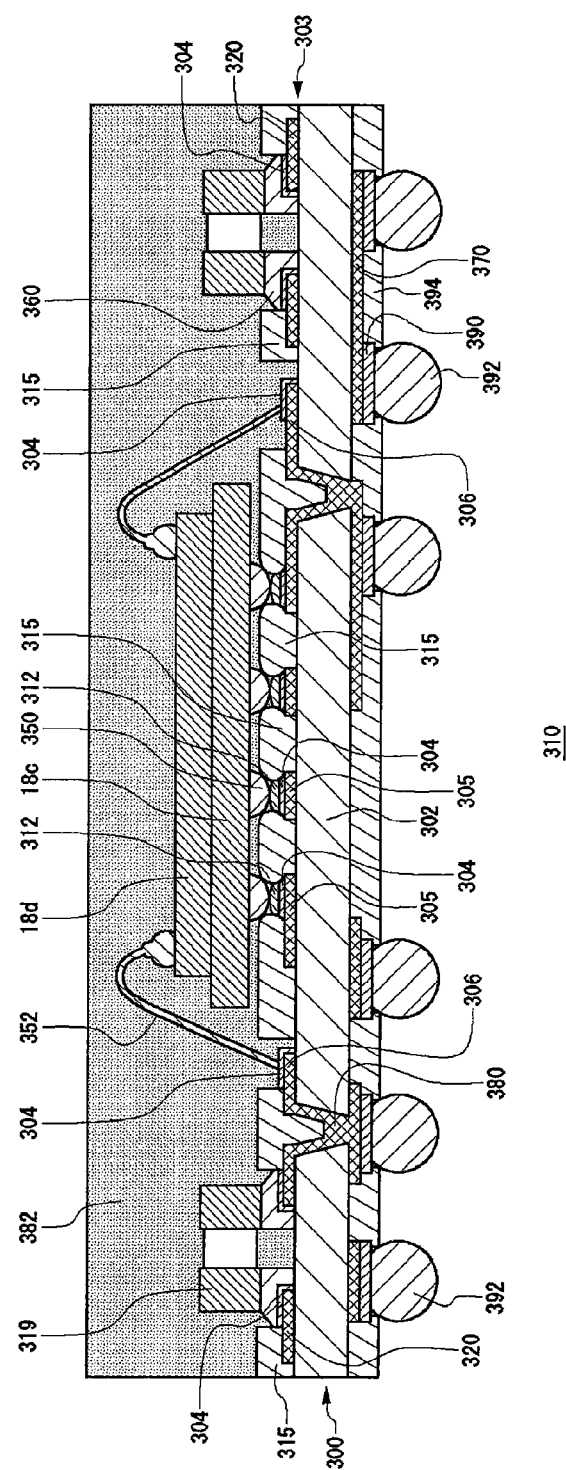
FIG. 14 is a sectional view showing the structure of a semiconductor module which has LSI chips mounted on a packaging board adapted to mount an electronic device according to a third embodiment.

FIG. 14 is a sectional view showing the structure of a semiconductor module 310 which has LSI chips mounted on a packaging board 300 according to a third embodiment. The semiconductor module 310 of the present embodiment includes circuit devices 18c and 18d such as an LSI, and passive elements 319 such as a resistor and a capacitor. Initially, a description will be given of the structure of the packaging board 300. A wiring layer 303 is patterned on an insulating layer 302, a core member. For flip-chip connection, flip-chip pads 305 having a nickel gold plating layer 304 are formed in the center area of the packaging board 300. Solder bumps 312 are formed on the nickel gold plating layer 304.

For wire bonding connection, wire bonding pads 306 having a nickel metal plating layer 304 are arranged around the flip-chip pads 305. Moreover, for the purpose of mounting the passive elements 319, passive element pads 320 having a nickel metal plating layer 304 are arranged around the wire bonding pads 306. Openings are formed in an insulating resin layer 315 so as to expose the flip-chip pads 305, the wire bonding pads 306, the passive element pads 320, and the wiring layer 303 in the peripheries thereof.

A predetermined pattern of a wiring layer 370 is formed on the underside of the insulating layer 302. The wiring layer 370 is electrically connected to the wiring layer 303 through vias 380. A nickel gold plating layer (electrolytic Au/Ni plating film) 390 is formed on electrode forming areas of the wiring layer 370. Solder balls 392 are also formed on the nickel gold plating layer 390. An insulating resin layer (photo solder resist) 394 is formed on the undersides of the insulating layer 302 and the wiring layer 370 so as to expose the solder balls 392.

A circuit device 18c is connected onto this packaging board 300 in a flip-chip fashion through the solder bumps 312 of the flip-chip pads and solder balls 350. A circuit device 18d is mounted on the circuit device 18c, and wire-bonded through the nickel gold plating layers 304 of the wire bonding pads and conductive members 352 such as gold wires. In addition, the passive elements 319 such as a resistor and a capacitor are mounted on the nickel gold plating layers 304 of the passive element pads arranged around the circuit devices 18c and 18d, using solder 360. The circuit devices 18c and 18d and the passive elements 319 are coated with a sealing resin 382 for packaging.

With such a packaging board 300 and the semiconductor module 310, the structure of the first embodiment can be applied to the areas of the flip-chip pads. That is, the insulating resin layer 315, the flip-chip pads 305, and the solder bumps 312 correspond to the solder resist layer 6, the pad electrodes 4, and the solder bumps 7 of the first embodiment, respectively.

Consequently, the multi-chip module with stacked circuit devices including LSIs can provide the same effects as in the first embodiment, thereby improving handleability and securing connection reliability.

Fourth Embodiment

A description will now be given of a mobile device provided with the semiconductor module of the present invention. By way of example of mobile device, a cell phone provided with the inventive module will be illustrated. Alternatively, the module may be mounted on electronic devices such as a personal digital assistant (PDA), a digital video camera (DVC) and a digital still camera (DSC).

Figure 15:
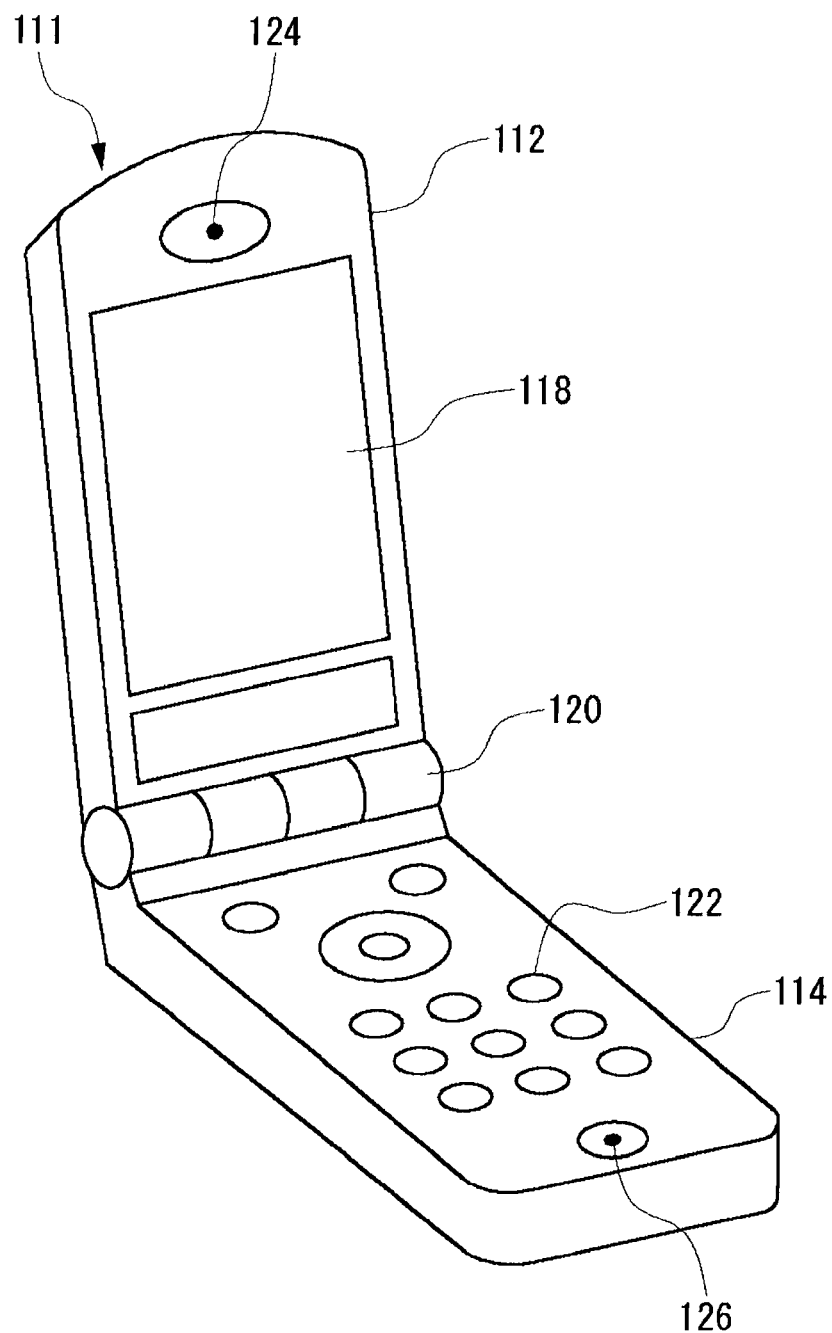
FIG. 15 is a diagram showing the structure of a cell phone according to a fourth embodiment.

FIG. 15 is a diagram showing the structure of a cell phone provided with the semiconductor module according to the first embodiment of the present invention. A cell phone 110 is constructed such that a first housing 112 and a second housing 114 are connected by a movable part 120. The first housing 112 and the second housing 114 are rotatable around the movable part 120. The first housing 112 is provided with a display unit 118 for displaying characters, images and the like to present information. The first housing 112 is also provided with a speaker unit 124. The second housing 114 is provided with a microphone unit 126 and a console 122 including control buttons. The semiconductor module according to the embodiment is built inside the cell phone 110.

Figure 16:
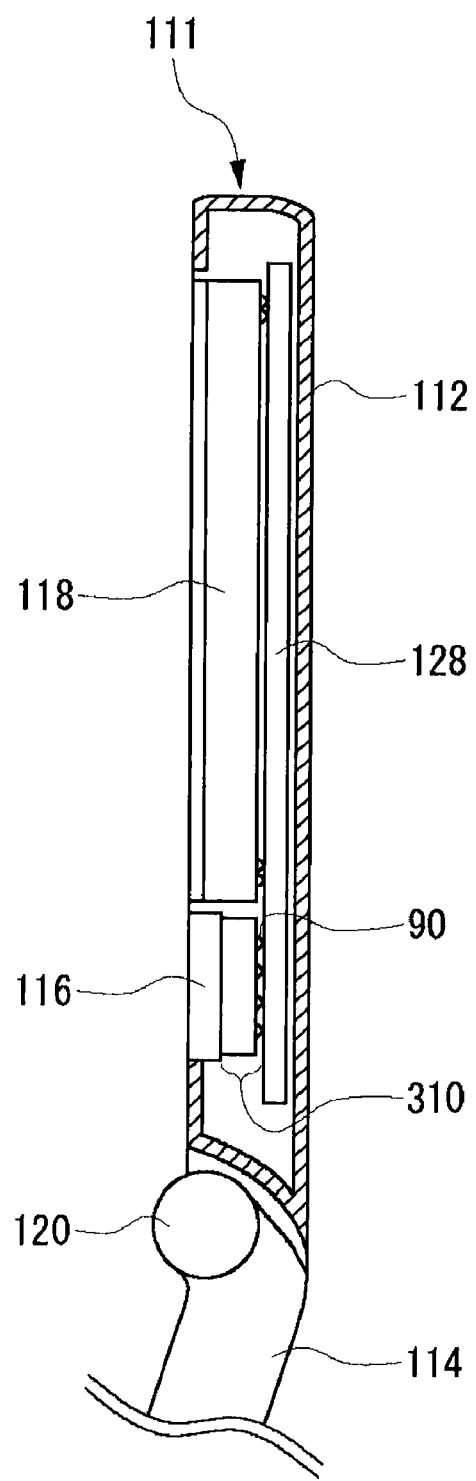
FIG. 16 is a partial sectional view (sectional view of a first housing) of the cell phone shown in FIG. 15.
Figure 17:
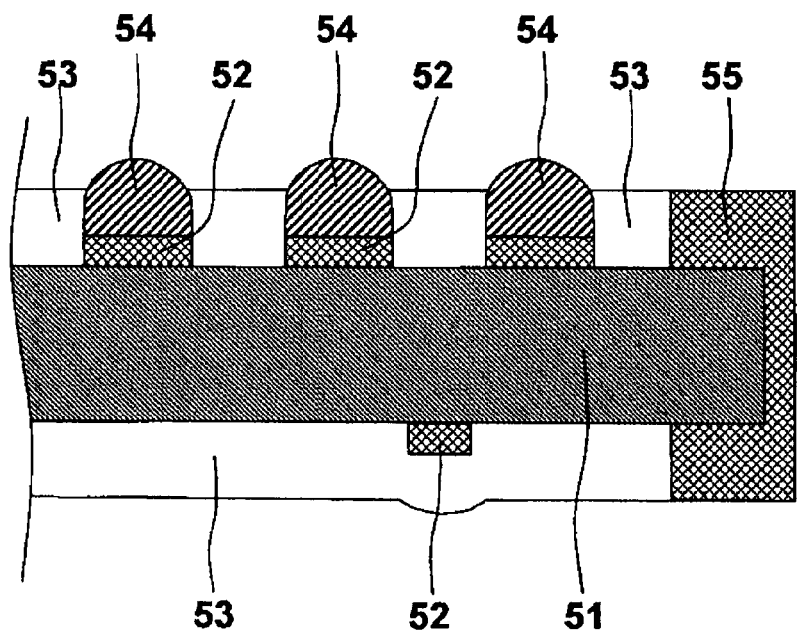
FIG. 17 is a sectional view of a conventional device mounting board.

FIG. 16 is a partial sectional view (sectional view of the first housing 112) of the cell phone shown in FIG. 15. The semiconductor module 310 according to the embodiment is mounted on a printed board 128 via an electrode 9 for external connection and is electrically connected to the display unit 118 and the like via the printed board 128. Underneath the semiconductor module 310 (the face opposite to the electrode 9) is provided a heat sink plate 116 such as a metal board. The plate 116 is operative to, for example, prevent heat generated by the semiconductor module 310 from being contained in the first housing 112 and dissipate heat outside the first housing 112 efficiently.

The mobile device provided with the semiconductor module according to the embodiment of the present invention provides the following advantages.

Connection reliability of the semiconductor module 310 is improved so that the reliability of the mobile device provided with the semiconductor module 310 is improved accordingly.

Other Embodiments

These packaging boards are not limited to the structures shown in the foregoing embodiments, and the foregoing embodiments may be practiced with appropriate modifications without departing from the gist of the present invention. Examples include the following:

(a) The foregoing embodiments have dealt with cases where the present invention is applied to a packaging board that is equipped with LSI chips. The present invention is not limited thereto, however, but may also be applied to circuit packaging boards that are equipped with circuit devices other than LSI chips, and to semiconductor integrated circuit apparatuses other than packaging boards.

(b) The foregoing second embodiment has dealt with a case where the present invention is applied to a packaging board having a wiring board of double-layer structure in which the second insulating layer and conductive layer are formed on the first conductive layer in succession. The present invention is not limited thereto, however, but may be applied to a packaging board having a wiring board of single-layer structure. It may also be applied to a packaging board having a wiring board in which third insulating layer and conductive layer are formed further on the second conductive layer in succession. It may also be applied to circuit boards having a wiring board of multilayer structure with four or more layers.

(c) The foregoing second embodiment has dealt with a case where the LSI chip 18*b* uses the solder balls 7*b* as the terminals intended for connection with the packaging board. Nevertheless, gold(Au)-based connection terminals are also applicable. Connection terminals that are formed by plating copper (Cu) connection parts with solder may also be used.

What is claimed is:

1. A packaging board adapted to mount a device comprising:
 a pad electrode formed on a substrate;
 an insulating layer provided on an outermost layer covering the substrate, so as to produce an opening at least in part in an area over the pad electrode; and
 a solder bump formed on the pad electrode inside the opening and configured to be in direct contact with a solder ball formed in a circuit device to be mounted,
 wherein the opening has a side convexly curved toward the solder bump and a top of a surface of the solder bump is lower than a top lip of the opening.

2. The packaging board according to claim 1, wherein the pad electrode has a surface which is plated with nickel and gold.

3. The packaging board according to claim 1, wherein the top of the surface of the solder bump is arranged to contact a solder ball.

4. The packaging board according to claim 1, wherein an entire exposed portion of the surface of the solder bump is lower than the top lip of the opening.

5. The packaging board according to claim 1, wherein a tangent to a lowermost part of a side of the insulating layer and a surface of the pad electrode form an angle greater than an angle of contact of the solder bump onto the pad electrode.

6. The packaging board according to claim 5, wherein the pad electrode has a surface which is plated with nickel and gold.

7. The package board according to claim 1 wherein if a is smaller than r, then a difference d between a thickness of the insulating layer and a thickness of the joint layer satisfies a relational expression $d \leq r-(r^2-a^2)^{1/2}$, where r is a radius of curvature of a solder ball corresponding to the solder bump, formed on a circuit device to be mounted, and a is a radius of the opening.

8. The packaging board according to claim 7 wherein the surface of the pad electrode is plated with nickel and gold.

9. The packaging board according to claim 1, wherein the opening increases in radius toward its top.

10. The packaging board according to claim 9, wherein the pad electrode has a surface which is plated with nickel and gold.

11. The packaging board according to claim 9, wherein a tangent to a lowermost part of a side of the insulating layer and a surface of the pad electrode form an angle greater than an angle of contact of the solder bump onto the pad electrode.

12. The packaging board according to claim 11, wherein the pad electrode has a surface which is plated with nickel and gold.

13. A semiconductor module comprising:
   a packaging board comprising:
      a pad electrode formed on a substrate;
      an insulating layer provided on an outermost layer covering the substrate, so as to produce an opening at least in part in an area over the pad electrode; and
      a solder bump formed on the pad electrode inside the opening, wherein the opening has a side convexly curved toward the solder bump and a top of a surface of the solder bump is lower than a top lip of the opening; and
   a circuit device having a solder ball, wherein the solder bump and the solder ball are directly joined to each other.

14. A portable apparatus comprising the semiconductor module according to claim 13.

15. The semiconductor module according to claim 13, wherein the top of the surface of the solder ball is directly joined to the solder ball.

16. The semiconductor module according to claim 13, wherein an entire exposed portion of the surface of the solder bump is lower than the top lip of the opening.

* * * * *